(12) United States Patent
Xie et al.

(10) Patent No.: US 10,312,333 B2
(45) Date of Patent: Jun. 4, 2019

(54) FIN-TYPE SEMICONDUCTOR DEVICE

(71) Applicants: Semiconductor Manufacturing International (Beijing) Corporation, Beijing (CN); Semiconductor Manufacturing International (Shanghai) Corporation, Shanghai (CN)

(72) Inventors: Xinyun Xie, Shanghai (CN); Ming Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/893,319

(22) Filed: Feb. 9, 2018

(65) Prior Publication Data
US 2018/0175151 A1 Jun. 21, 2018

Related U.S. Application Data

(62) Division of application No. 15/212,984, filed on Jul. 18, 2016, now Pat. No. 9,923,065.

(30) Foreign Application Priority Data

Jul. 29, 2015 (CN) .......................... 2015 1 0456885

(51) Int. Cl.
H01L 27/00 (2006.01)
H01L 29/00 (2006.01)
(Continued)

(52) U.S. Cl.
CPC ........ H01L 29/408 (2013.01); H01L 21/0228 (2013.01); H01L 21/02178 (2013.01);
(Continued)

(58) Field of Classification Search
CPC ............. H01L 27/0886; H01L 27/0211; H01L 27/121; H01L 29/408; H01L 29/0653;
(Continued)

(56) References Cited

U.S. PATENT DOCUMENTS 8,772,860 B2 * 7/2014 Huang .............. H01L 29/66795
257/327
9,530,775 B2 12/2016 Cai et al.
(Continued)

FOREIGN PATENT DOCUMENTS

CN 102820334 A 12/2012

OTHER PUBLICATIONS

Quirk et al, Semiconductor Manufacturing Technology, 2001, Prentice-Hall Inc., NJ, pp. 436-439; 456-457, 464-465, published Dec. 2001.

Primary Examiner — Nikolay K Yushin
(74) Attorney, Agent, or Firm — Anova Law Group, PLLC

(57) ABSTRACT

Fin-type semiconductor device is provided. The semiconductor device includes: a semiconductor substrate and an insulating layer on sidewalls of the plurality of fins. A plurality of fins is projected on a surface of the semiconductor substrate. The insulating layer is located on the surface of the semiconductor substrate. A surface of the insulating layer is lower than top surfaces of the plurality of fins. A thermal conductivity of the insulating layer is larger than a thermal conductivity of silicon oxide.

13 Claims, 6 Drawing Sheets

(51) Int. Cl.
*H01L 29/40* (2006.01)
*H01L 29/06* (2006.01)
*H01L 29/78* (2006.01)
*H01L 29/66* (2006.01)
*H01L 21/02* (2006.01)
*H01L 21/762* (2006.01)
*H01L 21/3105* (2006.01)
*H01L 21/8234* (2006.01)
*H01L 27/02* (2006.01)
*H01L 27/088* (2006.01)
*H01L 21/00* (2006.01)
*H01L 23/367* (2006.01)
*H01L 21/306* (2006.01)
*H01L 21/3065* (2006.01)
*H01L 21/308* (2006.01)

(52) U.S. Cl.
CPC .. *H01L 21/31053* (2013.01); *H01L 21/76224* (2013.01); *H01L 21/76229* (2013.01); *H01L 21/76232* (2013.01); *H01L 21/823431* (2013.01); *H01L 27/0211* (2013.01); *H01L 27/0886* (2013.01); *H01L 29/0653* (2013.01); *H01L 29/66795* (2013.01); *H01L 29/7851* (2013.01); *H01L 21/3065* (2013.01); *H01L 21/3083* (2013.01); *H01L 21/30608* (2013.01); *H01L 23/3677* (2013.01)

(58) Field of Classification Search
CPC ........... H01L 29/7851; H01L 29/66795; H01L 21/0228; H01L 21/02178; H01L 21/76232; H01L 21/31053; H01L 21/823431; H01L 21/76224; H01L 21/76229; H01L 21/30608; H01L 21/3065; H01L 21/3083; H01L 23/3677; H01L 23/5326; H01L 23/3738; H01L 23/405; H01L 23/485
See application file for complete search history.

(56) References Cited

U.S. PATENT DOCUMENTS

2012/0299099 A1* 11/2012 Huang .............. H01L 29/66795
                                                                257/347
2013/0082310 A1    4/2013  Yin et al.
2014/0367795 A1   12/2014  Cai et al.

* cited by examiner

FIN-TYPE SEMICONDUCTOR DEVICE

CROSS-REFERENCES TO RELATED APPLICATIONS

This application is a divisional of U.S. patent application Ser. No. 15/212,984, filed on Jul. 18, 2016, which claims the priority of Chinese patent application No. 201510456885.0, filed on Jul. 29, 2015, the entire content of all of which is incorporated herein by reference.

TECHNICAL FIELD

The disclosed subject matter generally relates to semiconductor technology and, more particularly, relates to a fin-type semiconductor device.

BACKGROUND

With the continuous development of semiconductor technology and the continuous decreasing of the process node, gate-last technology has been widely used to obtain a desired threshold voltage and an improved device performance. However, when the critical dimension (CD) of the device further decreases, even with the gate-last process, the conventional MOS field effect transistor structure is unable to meet the demand of the device performance. Therefore, multi-gate devices, as an alternative to the conventional devices, have been widely considered.

A fin field effect transistor (Fin FET) is a common multiple gate device. FIG. 1 shows a perspective schematic structural diagram of an existing fin FET. As illustrated, an existing fin FET can comprises: a semiconductor substrate 10, a fin portion 14, a dielectric layer 11, and a gate structure 12. The fin portion 14 is projected on the semiconductor substrate 10. The fin portion 14 is generally formed by etching the semiconductor substrate 10. The dielectric layer 11 covers the surface of the semiconductor substrate 10 and a portion of the sidewalls of the fin portion 14. The gate structure 12 is disposed astride the fin portion 14 to cover the top and sidewalls of the fin portion 14. The gate structure 12 comprises a gate dielectric layer (not shown in FIG. 1) and a gate electrode layer (not shown in FIG. 1) located on the gate dielectric layer. For the existing fin FET, the top portion and the sidewalls of the fin portion that contact with the gate structure 12 are channel regions. That is, the existing fin FET can have multiple gates which are conducive to increase the drive current and to improve the device performance.

However, with further size decreasing of the process node, the performance of the semiconductor devices that contain the above-described existing fin FET remains problematic. The disclosed semiconductor device and fabrication method are directed to solve one or more problems set forth above and other problems

BRIEF SUMMARY

One aspect of the disclosed subject matter provides a semiconductor device, comprising: a semiconductor substrate, wherein a plurality of fins are projected on a surface of the semiconductor substrate; and an insulating layer on sidewalls of the plurality of fins, wherein the insulating layer is located on the surface of the semiconductor substrate, a surface of the insulating layer is lower than top surfaces of the plurality of fins, and a thermal conductivity of the insulating layer is larger than a thermal conductivity of silicon oxide.

In some embodiments, a material of the insulating layer is aluminum oxide.

In some embodiments, a material of the insulating layer is aluminum nitride.

In some embodiments, a bottom portion of one fin is recessed from the sidewalls to the center of the one fin.

In some embodiments, a width of the bottom portion of the one fin is larger than or equal to ⅓ of a width of a top portion of the one fin.

In some embodiments, the semiconductor device further comprises an oxide layer formed on the sidewalls of the plurality of fins, wherein the insulating layer covers the oxide layer.

In some embodiments, the semiconductor substrate includes a first region and a second region; both the first region and the second region include a plurality of fins; and the insulating layer is located on the sidewalls of the plurality of fins of the first region and the second region.

Another aspect of the disclosed subject matter provides a method for forming a semiconductor device, comprising: providing a semiconductor substrate including a plurality of fins projected on a surface of the semiconductor substrate; forming an insulating film on top portions and sidewalls of the plurality of fins, wherein the insulating film is located on the surface of the semiconductor substrate, and a thermal conductivity of the insulating layer is larger than a thermal conductivity of silicon oxide; and etching a portion of the insulating film to expose top surfaces and a part of sidewalls of the plurality of fins and to form an insulating layer that has a surface lower than the top surfaces of the plurality of fins.

In some embodiments, the insulating film is formed by using an atomic layer deposition process.

In some embodiments, the insulating film is made by aluminum oxide material.

In some embodiments, the insulating film is made by aluminum nitride material.

In some embodiments, the method further comprises: forming a hard mask film covering the top surfaces of the plurality of fins; forming a plurality of sidewalls covering the sidewalls of the plurality of fins; and etching bottom portions of the plurality of fins to form recesses from the sidewalls towards the centers of the plurality of fins.

In some embodiments, a width of the bottom portion of one fin is larger than or equal to ⅓ of a width of a top portion of the one fin.

In some embodiments, the bottom portions are etched by using a wet etching process.

In some embodiments, the bottom portions are etched by using a dry etching process.

In some embodiments, the bottom portions are etched by using a combining process of a dry etching method and a wet etching method.

In some embodiments, a chemical reagent used in the wet etching process is tetramethylammonium hydroxide.

In some embodiments, a gas flow of the dry etching method includes 50 sccm-1000 sccm of $CF_4$, 100 sccm-3000 sccm of He, and 50 sccm-1000 sccm of $O_2$; an etching power is 100 W-3000 W; and an etching chamber pressure is 0.1 Mt-20 Mt.

In some embodiments, the method further comprises: oxidizing surfaces of the plurality of fins and the semiconductor substrate to form an oxide film that covers the top surfaces and sidewalls of the plurality of fins and covers the surface of the semiconductor substrate.

In some embodiments, the method further comprises: removing the sidewalls; and planarizing the insulating film and the oxide film.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
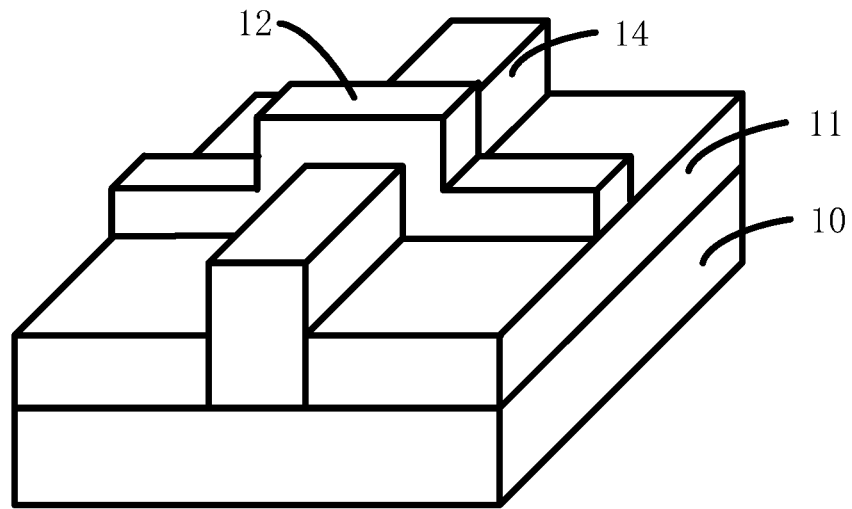
FIG. 1 illustrates a structural schematic diagram of an existing fin field effect transistor.

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

As mentioned in the background section, the performance of the semiconductor devices that contain the existing fin FET remains problematic.

For example, a silicon oxide isolation structure is often used between the adjacent fins in the existing fin FET. Since the silicon oxide has a poor thermal conductivity which is only 7.6 W/mK, when a semiconductor device containing the existing fin FET is in operation, the heat generated in the fins and the peripheral regions of the semiconductor substrate is difficult to be timely conducted away. That is, the semiconductor device has a poor heat dissipation. Therefore, the temperature of the semiconductor device may rapidly increase, which may impact its performance.

On the other hand, comparing to the thermal conductivity of the traditional material of silicon oxide, the thermal conductivity of aluminum nitride is much higher, which is up to 150 W/mK-180 W/mK. Additionally, aluminum nitride has desired properties including high pressure-resistance, high temperature-resistance, and high corrosion-resistance. By using the aluminum nitride as the material of the insulating layer for isolating the fins, the heat dissipation of the semiconductor device can be improved, and the insulation performance of semiconductor devices in a complex environment can also be effectively improved as well.

Figure 10:
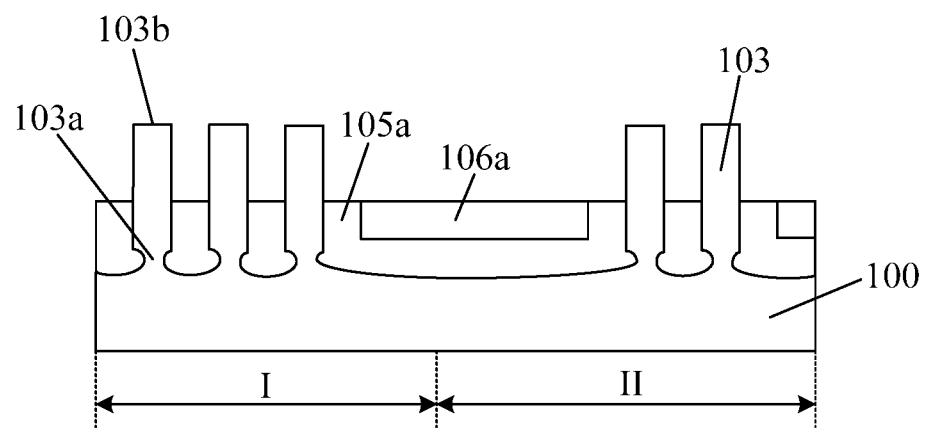
Figure 11:
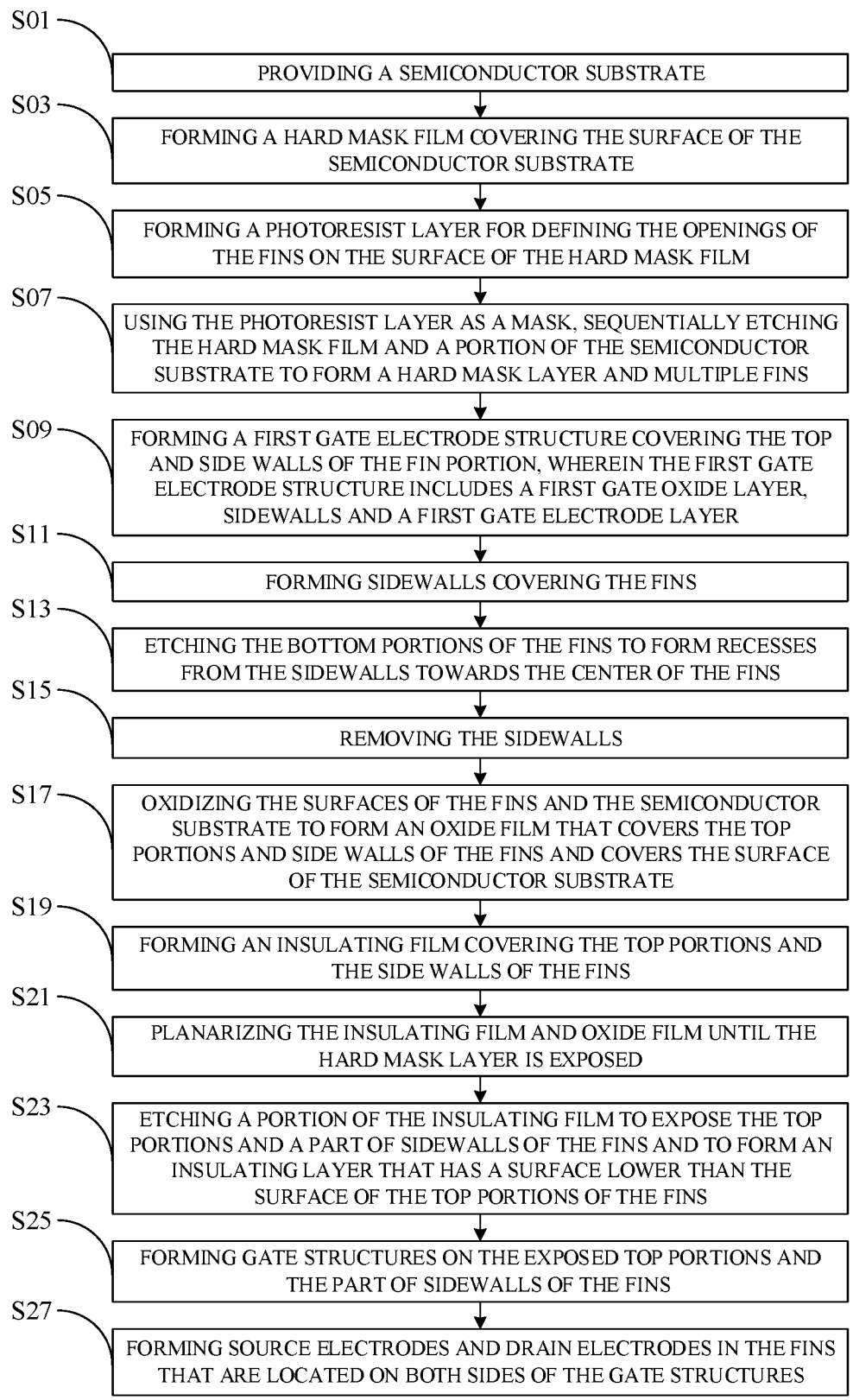
FIG. 11 illustrates a flow chart of an exemplary method for forming a fin field effect transistor in accordance with various embodiments of the disclosed subject matter.

Referring to FIG. 11, a flow chart of an exemplary method for forming a fin field effect transistor is shown in accordance with various embodiments of the disclosed subject matter. And referring to FIGS. 2-10, cross sectional structures of an exemplary fin field effect transistor corresponding to certain stages of a fabricating process are shown in accordance with various embodiments of the disclosed method illustrated in FIG. 11.

Figure 2:
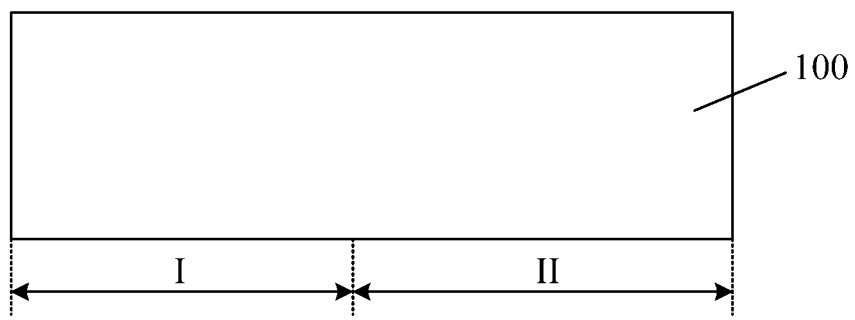
FIGS. 2-10 illustrate cross sectional structures of an exemplary fin field effect transistor corresponding to certain stages of a fabrication process consistent with various embodiments of the disclosed subject matter.

As shown in FIG. 11, at the beginning of the fabrication process, a semiconductor substrate 100 can be provided at step S01. FIG. 2 illustrates a corresponding fin field effect transistor structure.

The semiconductor substrate 100 can be used as a platform for the subsequently formed fin FET. A material of the semiconductor substrate 100 may be amorphous silicon, monocrystalline silicon, or polycrystalline silicon. The semiconductor substrate 100 may also be made of silicon, germanium, silicon germanium, gallium arsenide, or any other suitable semiconductor material. The semiconductor substrate 100 may have a single material structure, or may have a composite structure, such as a silicon on an insulator. In one embodiment, the material of the semiconductor substrate 100 is silicon, and the semiconductor substrate 100 includes a first region I and the second area II, which are both used for forming multiple fins in the subsequent steps.

Figure 3:
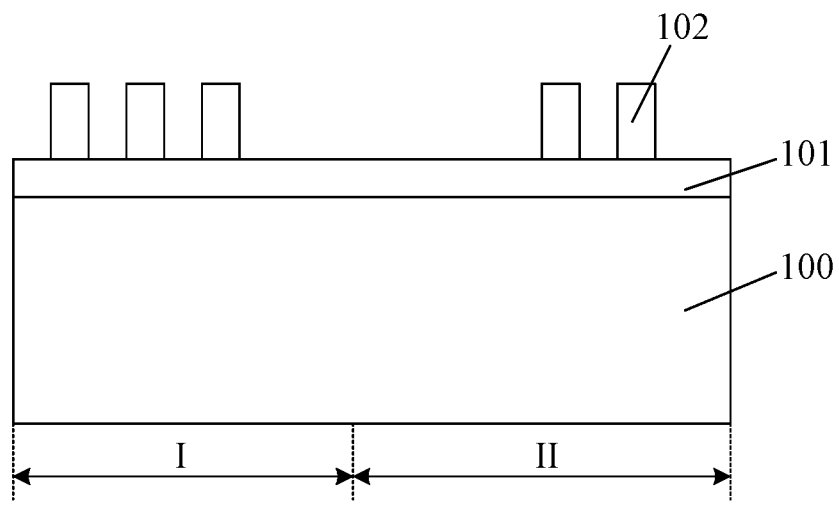

Turning back to FIG. 11, at step S03, a hard mask film covering the surface of the semiconductor substrate can be formed. Next, at step S05, a photoresist layer for defining the openings of the fins can be formed on the surface of the hard mask film. FIG. 3 illustrates a corresponding fin field effect transistor structure.

Referring to FIG. 3, a hard mask film 101 can be formed covering the surface of the semiconductor substrate 100, and a photoresist layer 102 for defining the openings of the fins can be formed on the surface of the hard mask film 101.

The hard mask film 101 is used to ensure the quality of the top of the fins during the subsequent process of etching the semiconductor substrate 100 to form the fins. A process of forming the hard mask film 101 can be a deposition process, such as a chemical vapor deposition process. A material of the hard mask film 101 can be silicon nitride, titanium nitride, etc. A thickness of the hard mask film 101 can be determined by actual needs, such as for protecting the top of the fins during the etching process. In one embodiment, the hard mask film 101 is a silicon nitride film.

The photoresist layer 102 is used to define the shapes and positions of the fins. The photoresist layer 102 can be either positive photoresists or negative photoresists. The opening positions of the photoresist layer 102 correspond to the positions of the fin portion. In one embodiment, the photoresist layer 102 includes multiple openings for forming multiple fins in both the first area I and the second area II in the subsequent steps.

Figure 4:
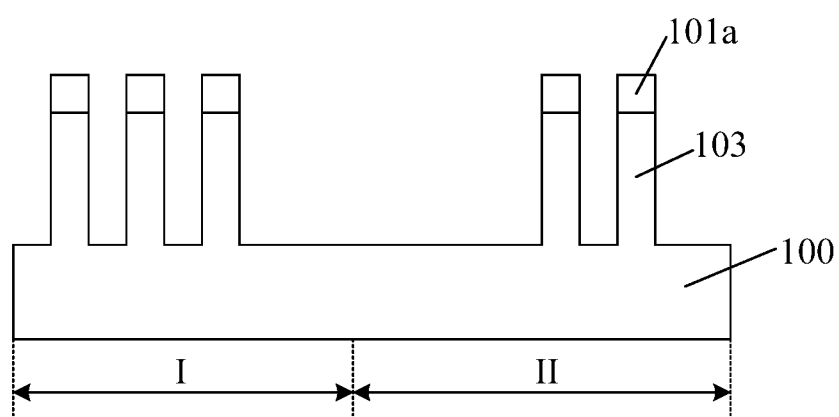

Turning back to FIG. 11, at step S07, using the photoresist layer as a mask, the hard mask film and a portion of the semiconductor substrate can be sequentially etched to form a hard mask layer and multiple fins. FIG. 4 illustrates a corresponding fin field effect transistor structure.

Referring to FIG. 4, using the photoresist layer 102 (shown in FIG. 3) as a mask, the hard mask film 101 (shown in FIG. 3) and a portion of the semiconductor substrate 100 are sequentially etched to form hard mask layer 101a and fins 103.

The hard mask layer 101a is used for further protecting the fins 103 from being damaged in the subsequent processes. The hard mask layer 101a is formed by etching the hard mask film 101, so that a material of the hard mask layer 101a is the same material of the hard mask film 101, such as silicon nitride, titanium nitride, etc. In one embodiment, the material of the hard mask layer 101a of silicon nitride.

The fins 103 are foundations for forming the fin field effect transistor in the subsequent processes. In one embodiment, the fins 103 is formed by etching the semiconductor substrate 100, so that a material of the fins 103 is the same material of the semiconductor substrate 100.

In some other embodiments, the fins 103 can be formed by etching a semiconductor layer located on the surface of the semiconductor substrate 100. A material of the semiconductor layer may be different from the material of the semiconductor substrate 100. That is, the material of the fins 103 may also be different from the material of the semiconductor substrate 100.

The fins 103 may have a single fin portion or multiple fins. In one embodiment, both the first region I and the second region II have multiple fins 103. The adjacent fins 103 can be isolated from each other in the subsequent processes.

After forming the hard mask layer 101a, the openings of the photoresist layer 102 have been transferred to the hard mask layer 101a. As such, the photoresist layer 102 can be removed at this point. That is, the photoresist layer 102 either can be removed immediately after forming the hard mask layer 101a, or can be removed after forming the fins 103.

Turning back to FIG. 11, at step S09, a first gate electrode structure (not shown in the figures) covering the top and sidewalls of the fin portion can be formed, wherein the first gate electrode structure includes a first gate oxide layer, sidewalls and a first gate electrode layer.

Figure 5:
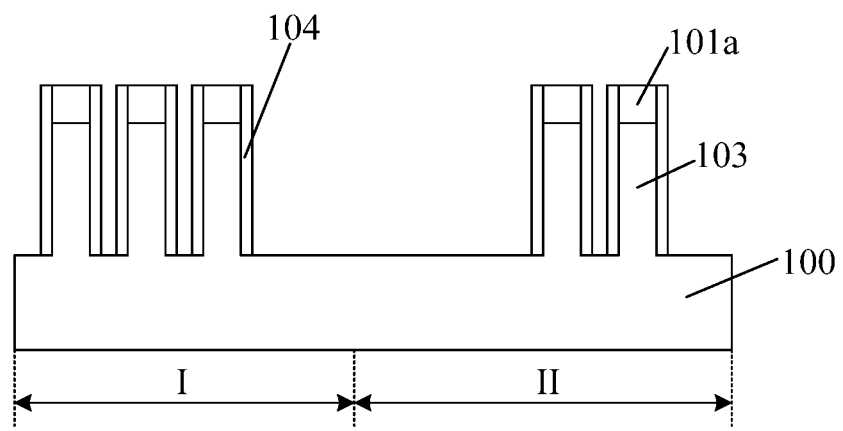

Next, at step S11, sidewalls 104 covering the fins can be formed. FIG. 5 illustrates a corresponding fin field effect transistor structure.

The sidewalls 104 and the hard mask layer 101a are used for protecting the fins 103 from being damaged in the subsequent processes. In some embodiments, a process for forming the sidewalls 104 includes the following steps: forming a sidewall film (not shown in the figures) covering the top portions and sidewalls of the fins 103, as well as the surface of the semiconductor substrate 100; etching the sidewall film to expose the hard mask layer 101a on the top portions of the fins 103, as well as the surface of the semiconductor substrate 100. As such, the sidewalls 104 covering the hard mask layer 101a and the sidewalls of the fins 103 are formed.

Comparing to the material of the semiconductor substrate, a material of the sidewalls 104 can have a large difference of the etching selectivity. For example, a material of the sidewalls 104 can be silicon nitride, titanium nitride, etc. Thus, in a subsequent process for removing the sidewalls 104, the damage to the fins 103 can be reduced. In some embodiments, the material of the sidewalls 104 can be silicon nitride, which is the same material of the hard mask layer 101a.

Figure 6:
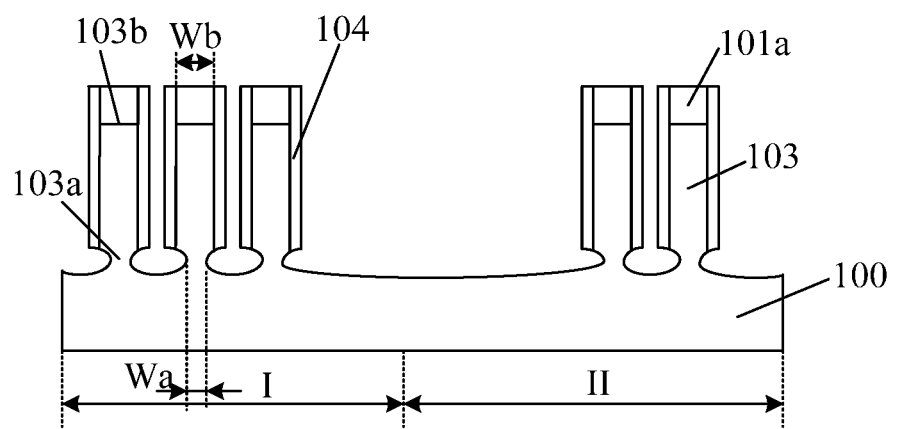

Turning back to FIG. 11, at step S13, the bottom portions of the fins can be etched to form recesses from the sidewalls towards the center of the fins. FIG. 6 illustrates a corresponding fin field effect transistor structure.

Referring to FIG. 6, the bottom portions 103a of the fins 103 can be etched to form recesses from the sidewalls 104 towards the center of the fins 103. A width Wa of the bottom portions 103a of the fins 103 can be larger than or equal to one third of the width Wb of the top portions 103b of the fins 103.

Since the fin portion 103 are projected from the surface of the semiconductor substrate 100, subsequently formed gate electrodes based on the fins 103 are relatively far from the bottom portions 103a of the fins 103. When the fin FET is in a working condition, the gate electrode has a weak control to the bottom portions 103a of the fin portion 103, resulting in a generation of the leakage current in the regions, which is likely to affect the performance of the semiconductor device. Therefore, in order to prevent the leakage current, the bottom portions 103a of the fins 103 can be etched to form recesses from the sidewalls 104 towards the center of the fins 103, and an oxide layer or an insulating layer formed in the subsequent processes can tightly pack the bottom portions 103a of the fins 103.

The bottom portions 103a of the fins 103 can be etched by using any suitable etching method, such as a wet etching process, a dry etching process, or a combining process of a dry etching method and a wet etching method. During the etching process, the sidewalls and the top portions 130b of the fins 103 can be covered by the sidewalls 104 and the hard mask layer 101a and thus cannot be etched.

In some embodiments, a material of the bottom portions 103a of the fins 103 can be silicon, and a chemical reagent used in the wet etching process can be an alkaline agent, such as tetramethylammonium hydroxide.

In some other embodiments, a combining process of a dry etching method and a wet etching method can be used. A gas flow during the can include 50 sccm-1000 sccm of $CF_4$, 100 sccm-3000 sccm of He, and 50 sccm-1000 sccm of $O_2$. An etching power can be 100 W-3000 W. An etching chamber pressure can be 0.1 Mt-20 Mt. A chemical reagent can be an alkaline agent, such as tetramethylammonium hydroxide.

In order to avoid a fracture of the etched fins 103, a width Wa of the bottom portions 103a of the fins 103 after the etching process should be larger than or equal to one third of the a width Wb of the top portions 103b of the fins 103.

Figure 7:
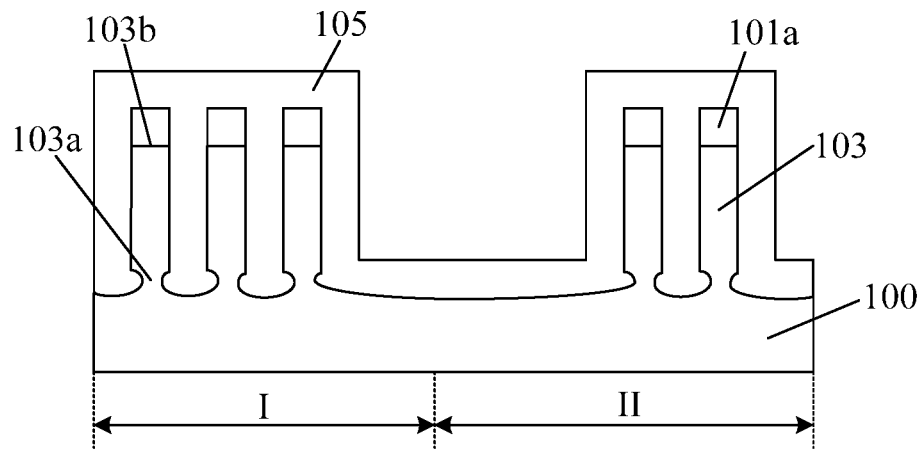

Turning back to FIG. 11, at step S15, the sidewalls can be removed. And at step S17, the surfaces of the fins and the semiconductor substrate can be oxidized to form an oxide film that covers the top portions and sidewalls of the fins and covers the surface of the semiconductor substrate. FIG. 7 illustrates a corresponding fin field effect transistor structure.

Referring to FIG. 7, the sidewalls 104 can be removed, and the surfaces of the fins 103 and the semiconductor substrate 100 can be oxidized to form an oxide film 105 that covers the top portions 103b and sidewalls of the fins 103 and covers the surface of the semiconductor substrate 100.

The sidewalls 104 are removed for facilitating the subsequent processes. The sidewalls 104 can be removed by using an etching process such as a dry etching process.

The oxide film 105 can be used for repairing the etched surfaces of the fins 103 and the semiconductor substrate 100. The oxide film 105 can be formed by using an oxidation process. A material of the oxide film 105 can be silicon oxide.

In some embodiments, after the surfaces of the fins 103 and the semiconductor substrate 100 being oxidized, an annealing process can be performed. During the annealing process, silicon atoms at the etched surfaces of the semiconductor substrate 100 can be transferred. As such, the microscopically uneven etched surfaces of the fins 103 and the semiconductor substrate 100 can become smoother and have higher quality, which can improve the performance of the semiconductor device.

In some embodiments, the multiple fins 103 in the first region I are relatively close to each other, and the multiple fins 103 in the second region II are also relatively close to each other. Thus, the oxide film 105 can fill the gaps between the fins 103 in the first region I and the second region II. However, there is a relatively large distance between the rightmost fin 103 in the first region I and the leftmost fin 103 in the second region II. Thus, the oxide film 105 may not fill the space and there may be a gap between the rightmost fin 103 in the first region I and the leftmost fin 103 in the second region II.

In some other embodiments, the multiple fins 103 in the first region I are relatively close to each other, while the multiple fins 103 in the second region II are relatively far from each other. Thus, the formed oxidation film 105 can fill the gaps between the fins 103 in the first region I, but cannot fill the gaps between the fins 103 in the second region II.

In some other embodiments, the multiple fins 103 in the first region I and the second region II are all relatively far from each other. Thus the formed oxidation film 105 cannot fill the gaps between the fins 103 in the first region I and the second region II.

Figure 8:
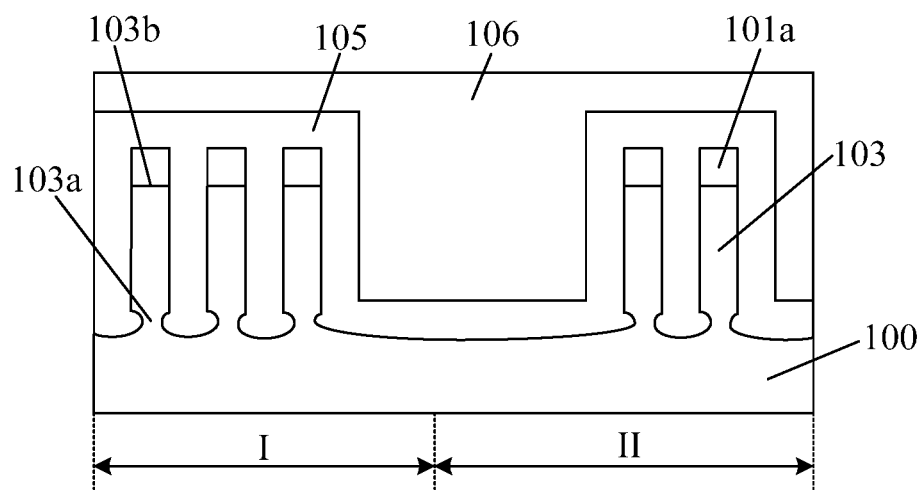

Turning back to FIG. 11, at step S19, an insulating film covering the top portions and the sidewalls of the fins can be formed. FIG. 8 illustrates a corresponding fin field effect transistor structure.

Referring to FIG. 8, an insulating film 106 covering the top portions 103b and the sidewalls of the fins 103 can be formed. The insulating film 106 can be located on the surface of the semiconductor substrate 100. A thermal conductivity of the insulating film 106 is larger than or equal to 30 W/mK.

As described above, the oxide film 105 has a poor thermal conductivity. For example, when the oxide film 105 is a silicon oxide film, the thermal conductivity can be only 7.6 W/mK. Therefore, if only the oxide film 105 is used as the isolating material of the fins 103, the heat at the fins 103 and the semiconductor substrate 100 is difficult to be timely conducted away when the semiconductor device is working. As such, the temperature of the semiconductor device can be easily and quickly increased, which can affect the performance of the semiconductor device.

Comparing to the thermal conductivity of the silicon oxide, the thermal conductivity of aluminum nitride is much higher, which is up to 150 W/mK-180 W/mK. Additionally, aluminum nitride has desired properties including high pressure-resistance, high temperature-resistance, and high corrosion-resistance. By using the aluminum nitride as the material of the insulating layer for isolating the fins 103, the heat dissipation of the semiconductor device can be improved, and the insulation performance of semiconductor devices in a complex environment can also be effectively improved as well. Thus, in some embodiments, after forming the oxide film 105, the insulating film 106 can be formed for isolating the fins 130 and also for improving the heat dissipation of the semiconductor device.

When the thermal conductivity of the insulating film 106 is larger than or equal to 30 W/mK, the cooling requirement of the semiconductor device can be satisfied, so that the semiconductor device may not be warmed rapidly and can have a superior device performance.

In some embodiments, the material of the insulating film 106 can be aluminum nitride which has a thermal conductivity of 150 W/mK-180 W/mK. The insulating film 106 can be formed by using an atomic layer deposition process. The formed insulating film 106 can have a good quality. When there are multiple fins 103, the insulating film 106 can fill the gaps between adjacent fins, which can help to form an insulation layer having a good insulating performance in the subsequent processes.

In some other embodiments, the material of the insulating film 106 may also be alumina having a thermal conductivity of 45 W/mK, or any other suitable material that has a thermal conductivity larger than the thermal conductivity of silicon oxide.

In some other embodiments, the insulating film 106 can be formed without forming the oxide film 105. Further, the insulating film 106 can fill all gaps between adjacent fins 103.

Figure 9:
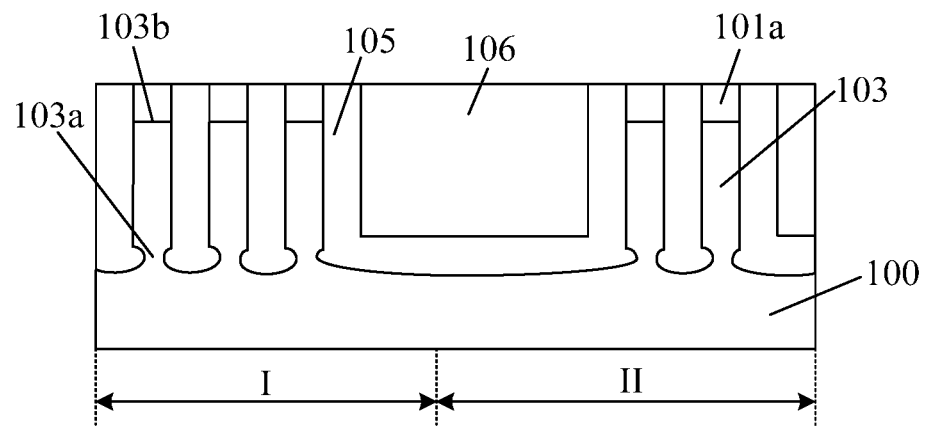

Turning back to FIG. 11, at step S21, the insulating film and oxide film can be planarized until the hard mask layer is exposed. FIG. 9 illustrates a corresponding fin field effect transistor structure.

Referring to FIG. 9, the insulating film 106 and oxide film 105 can be planarized until the hard mask layer 101a is exposed. In order to facilitate the subsequent processes, after forming the insulating film 106, a planarizing process can be performed to expose the hard mask layer 101a. The exposed hard mask layer 101a can be removed in a subsequent process. In some embodiments, the planarizing process can be a chemical mechanical grinding process. In some other embodiments, the planarization process can also be other suitable process, such as an etching process.

Turning back to FIG. 11, at step S23, a portion of the insulating film can be etched to expose the top portions and a part of sidewalls of the fins and to form an insulating layer that has a surface lower than the surface of the top portions of the fins. FIG. 10 illustrates a corresponding fin field effect transistor structure.

Referring to FIG. 10, a portion of the insulating film 106 (shown in FIG. 9) can be etched to expose the top portions 103b and a part of sidewalls of the fins 103 and form insulating layer 106a that has a surface lower than the surface of the top portions 103b of the fins 103.

The portion of the insulating film 106 can be etched to expose the top portions 103b and the part of sidewalls of the fins 103. Therefore, in the subsequent processes, gate structures can be formed on the exposed top portions 103b and the part of sidewalls of the fins 103, and source electrodes and drain electrodes can be formed in the fins 103 that are located on both sides of the gate structures.

In some embodiments, during the etching process for removing the portion of the insulating film 106, the hard mask layer 101a can protect the top portions 103b of the fins 103 from being damaged.

A suitable thickness of the hard mask layer 101a can be determined, such that, when the insulating layer 106a is formed, the hard mask layer 101a can be just etched completely to expose the top portions 103b of the fins 103.

In some other embodiments, after forming the insulating layer 106a, a portion of the hard mask layer 101a is still remaining. In that case, the remaining hard mask layer 101a can be removed in a further step.

When the portion of the insulating film 106 is being etched, the oxide film 105 (shown in FIG. 9) is also being etched to form oxide layers 105a at the same time. The oxide layer 105a wraps the bottom portions 103a of the fins 103 and covers the semiconductor substrate 100.

The insulating layer 106a can be used for isolating the adjacent fins 103, and the gate electrodes that are to be formed in subsequent process, as well as the semiconductor substrate 100, etc. In some embodiments, the insulating layer 106a and the oxidized layer 105a can work together to isolate the adjacent fins 103, and the gate electrodes that are to be formed in subsequent process, as well as the semiconductor substrate 100, etc.

Therefore, not only the leakage current at the bottom portions 103a of the fins 103 can be effectively reduced, a good insulation function can also be performed. Additionally, the formed semiconductor device can have a good thermal conductivity to fast radiate the heat. Thus, the temperature variation of the semiconductor device can be very small, and the performance of the semiconductor device can be merely affected by the temperature change.

Turning back to FIG. 11, at step S25, gate structures can be formed on the exposed top portions 103b and the part of sidewalls of the fins 103. And at step S27, source electrodes and drain electrodes can be formed in the fins 103 that are located on both sides of the gate structures.

It should be noted that the above steps of the flow diagram of FIG. 11 can be executed or performed in any order or sequence not limited to the order and sequence shown and described in the figure. Also, some of the above steps of the flow diagram of FIG. 11 can be executed or performed substantially simultaneously where appropriate or in parallel to reduce latency and processing times. Furthermore, it should be noted that FIG. 11 is provided as an example only. At least some of the steps shown in the figure may be performed in a different order than represented, performed concurrently, or altogether omitted. After the above-described steps, any other suitable processes can be performed.

Another aspect of the disclosed subject matter provides a semiconductor device fabricated by using the disclosed method described above. As illustrated in FIG. 10, the semiconductor device can include a semiconductor substrate 100, multiple fins 103 projected on the surface of the semiconductor substrate 100, an insulating layer 106a on the sidewalls of the multiple fins 103. The insulating layer 106a located on the surface of the semiconductor substrate 100, and the surface of the insulating layer 106a is lower than the surface of the top portions 103b of the fins 103. A thermal conductivity of the insulating layer 106a is larger than or equal to 30 W/mK.

In some embodiments, the semiconductor substrate 100 includes a first region I and a second region II. Multiple fins 103 are located on the surface of both the first region I and the second region II of the semiconductor substrate 100. The insulating layer 106a is on the sidewalls of the multiple fins 103 in the first region I and the second region II. A material of the insulating layer 106a is alumina or aluminum nitride. The bottom portions 103a of the fins 103 are recessed from the sidewalls to the centers of the fins 103. A width of the bottom portions 103a of the fins 103 is larger than or equal to ⅓ of the width of the top portions 103b of the fins 103. Sn oxide layer 105a is formed on the sidewalls of the fins 103. The oxide layer 105a wraps the bottom portions 103a of the fins 103. The insulating layer 106a covers the surfaces of the oxide layer 105a.

More detailed structure of the semiconductor device can be referred to the embodiments described above of the method for forming the semiconductor device.

In some embodiments, the fins are projected from the surface of the semiconductor substrate. Since the fins have a certain height, and thus are more sensitive to heat. The insulating layer on the sidewalls of the fins of the semiconductor device is made by an insulating material that has a thermal conductivity larger than or equal to 30 W/mK. As such, the insulating layer can ensure the insulation and improve the heat transfer rate at the same time. Accordingly, when the semiconductor device is working, the heat generated around the fins or in the semiconductor substrate can be conducted out through the insulating layer having a large thermal conductivity. Therefore, the temperature of the semiconductor can be rapidly reduced. The semiconductor device has an improved heat dissipation, and thus has an improved performance.

Further, a material of the insulating layer is aluminum nitride. Comparing to the thermal conductivity of the traditional material of silicon oxide, the thermal conductivity of aluminum nitride is much higher, which is up to 150 W/mK-180 W/mK. Additionally, aluminum nitride has desired properties including high pressure-resistance, high temperature-resistance, and high corrosion-resistance. By using the aluminum nitride as the material of the insulating layer for isolating the fins, the heat dissipation of the semiconductor device can be improved, and the insulation performance of semiconductor devices in a complex environment can also be effectively improved as well.

Further, the bottom portions of the fins are recessed from the sidewalls toward the center of the fins. A width Wa of the bottom portions 103a of the fins 103 can be larger than or equal to one third of the width Wb of the top portions 103b of the fins 103. The insulating layer can wrap the bottom portions of the fins to ensure the driving current of the semiconductor device and effectively reduce the leakage current of the semiconductor device at the same time.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A semiconductor device, comprising:
    a semiconductor substrate, wherein a plurality of fins are projected on a surface of the semiconductor substrate, a bottom portion of each of the plurality of fins has concave sidewalls, and a width of the bottom portion of each of the plurality of fins is smaller than a width of a top portion of each of the plurality of fins; and
    an insulating layer on sidewalls of the plurality of fins, wherein the insulating layer is located on the surface of the semiconductor substrate, a top surface of the insulating layer is lower than top surfaces of the plurality of fins and higher than bottom portion of each of the plurality of fins, and a thermal conductivity of the insulating layer is larger than a thermal conductivity of silicon oxide.

2. The semiconductor device of claim 1, wherein a material of the insulating layer is aluminum oxide.

3. The semiconductor device of claim 1, wherein a material of the insulating layer is aluminum nitride.

4. The semiconductor device of claim 1, wherein:
    the semiconductor substrate includes a first region and a second region;
    both the first region and the second region include a plurality of fins; and
    the insulating layer is located on the sidewalls of the plurality of fins of the first region and the second region.

5. The semiconductor device of claim 1, wherein:
    the insulating layer is made by aluminum oxide material.

6. The semiconductor device of claim 1, wherein:

the insulating layer is made by aluminum nitride material.

7. The semiconductor device of claim 1, wherein:

the insulating layer covers sidewalls of the bottom portion of each of the plurality of fins and at least a portion of sidewalls of the top portion of each of the plurality of fins.

8. The semiconductor device of claim 1, wherein:

the insulating layer covers sidewalls of the bottom portion of each of the plurality of fins and at least a portion of sidewalls of the top portion of each of the plurality of fins.

9. The semiconductor device of claim 1, wherein a bottom portion of each of the plurality of fins is recessed from corresponding sidewalls to the center of each of the plurality of fins.

10. The semiconductor device of claim 9, wherein a width of the bottom portion of each of the plurality of fins is larger than or equal to ⅓ of a width of a top portion of each of the plurality of fins.

11. The semiconductor device of claim 1, further comprising an oxide layer formed on the sidewalls of the plurality of fins, wherein the insulating layer covers the oxide layer.

12. The semiconductor device of claim 11, wherein:

the oxide layer has a convex surface at each end, the convex surface of the oxide layer matching the concave surface of the sidewalls of the bottom portion of each of the plurality of fins.

13. The semiconductor device of claim 11, wherein:

the oxide layer covers sidewalls of the bottom portion of each of the plurality of fins and at least the portion of the sidewalls of the top portion of each of the plurality of fins.

* * * * *